(12) United States Patent
Pietambaram et al.

(10) Patent No.: US 10,672,695 B2
(45) Date of Patent: Jun. 2, 2020

(54) MULTI-LAYER MOLDED SUBSTRATE WITH GRADED CTE

(71) Applicant: Intel Corporation, Santa Clara, CA (US)

(72) Inventors: Srinivas Pietambaram, Gilbert, AZ (US); Rahul N. Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/061,890

(22) PCT Filed: Dec. 23, 2015

(86) PCT No.: PCT/US2015/000185
§ 371 (c)(1),
(2) Date: Jun. 13, 2018

(87) PCT Pub. No.: WO2017/111772
PCT Pub. Date: Jun. 29, 2017

(65) Prior Publication Data
US 2018/0366399 A1  Dec. 20, 2018

(51) Int. Cl.
*H01L 23/498* (2006.01)
*H01L 23/373* (2006.01)
*H01L 21/48* (2006.01)
*H01L 23/28* (2006.01)

(52) U.S. Cl.
CPC .... *H01L 23/49822* (2013.01); *H01L 21/4857* (2013.01); *H01L 23/28* (2013.01); *H01L 23/3735* (2013.01)

(58) Field of Classification Search
CPC .......... H01L 23/49822; H01L 21/4857; H01L 23/3735
USPC ....................................................... 257/668
See application file for complete search history.

(56) References Cited

U.S. PATENT DOCUMENTS

| 5,080,959 A | 1/1992 | Tanaka et al. |
| 6,399,892 B1 | 6/2002 | Milkovich et al. |
| 2002/0096759 A1* | 7/2002 | Hirano ................ H01L 23/3737 257/706 |
| 2004/0166194 A1 | 8/2004 | Trudeau |
| 2006/0043567 A1 | 3/2006 | Palanduz |

(Continued)

FOREIGN PATENT DOCUMENTS

| JP | 2004001301 A | 1/2004 |
| JP | 2006270065 A | 10/2006 |

(Continued)

OTHER PUBLICATIONS

"International Application Serial No. PCT/US2015/000185, International Search Report dated Sep. 20, 2016", 3 pgs.

(Continued)

*Primary Examiner* — Tong-Ho Kim
(74) *Attorney, Agent, or Firm* — Schwegman Lundberg & Woessner, P.A.

(57) ABSTRACT

This document discusses, among other things, a multi-layer molded substrate having layers with a graded coefficients of thermal expansions (CTEs) to optimize thermal performance of the multi-layer molded substrate with first and second structures attached to top and bottom surfaces of the multi-layer molded substrate, respectively.

20 Claims, 3 Drawing Sheets

(56) References Cited

U.S. PATENT DOCUMENTS

| | | | |
|---|---|---|---|
| 2007/0138631 A1 | 6/2007 | Cho | |
| 2011/0074046 A1* | 3/2011 | Sunohara | H01L 23/49822 257/778 |
| 2011/0285005 A1 | 11/2011 | Lin et al. | |
| 2013/0270719 A1* | 10/2013 | Malatkar | H01L 23/48 257/777 |

FOREIGN PATENT DOCUMENTS

| | | |
|---|---|---|
| JP | 2012209402 A | 10/2012 |
| WO | WO-2017111772 A1 | 6/2017 |

OTHER PUBLICATIONS

"International Application Serial No. PCT/US2015/000185, Written Opinion dated Sep. 20, 2016", 6 pgs.
"European Application Serial No. 15911479.2, Extended European Search Report dated Sep. 4, 2019", 7 pgs.
"International Application Serial PCT/US2015/000185, International Preliminary Report on Patentability dated Jul. 5, 2018", 8 pgs.

* cited by examiner

MULTI-LAYER MOLDED SUBSTRATE WITH GRADED CTE

CROSS-REFERENCE TO RELATED APPLICATION

This application is a U.S. National Stage Filing under 35 U.S.C. 371 from International Application No. PCT/US2015/000185, filed on Dec. 23, 2015, and published as WO 2017/111772, which application is incorporated herein by reference in its entirety.

TECHNICAL FIELD

This document relates generally to semiconductor substrates and more particularly to a multi-layer molded semiconductor substrate with a graded coefficient of thermal expansion (CTE).

BACKGROUND

Polymeric materials have various uses in the semiconductor technologies, including as adhesives, encapsulates, packaging, substrates, or fill. Stiffness and warpage due to thermal considerations is a challenge in the microelectronics industry that arises due to mismatch in coefficient of thermal expansion (CTE) between interacting components, such as a die and a substrate, a copper layer and a polymer, etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

MIS-BGA (Mold Interconnect System (MIS) Ball Grid Array (BGA)) packaging architecture is an attractive semiconductor packaging solution due to its relatively low profile (z-height) and low cost, both process and material, as laser drilling is typically not required and mold compound is typically less expensive than pre-impregnated composite fibers (prepreg, PP) or other build-up material.

Different structures in a microelectronic system can be packaged using different semiconductor packaging techniques, due to, among other things, variation in thermal requirements among the structures and the cost of the different packaging techniques. Accordingly, different microelectronic structures are packaged using materials having varying coefficients of thermal expansion (CTEs). Thermal mismatch (e.g., mismatched CTE) between coupled components of a system can lead to thermo-mechanical issues, such as warpage or stress.

The present inventors have recognized, among other things, a multi-layer molded substrate having a graded CTE across the layers to optimize thermal performance of the molded substrate to structures coupled thereto.

Figure 1:
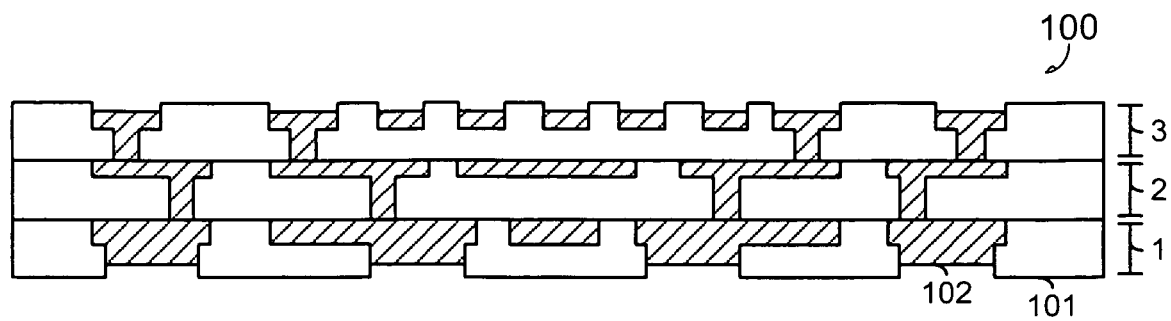
FIG. 1 illustrates generally an example multi-layer molded substrate including first, second, and third layers.

FIG. 1 illustrates generally a multi-layer molded substrate 100 including first, second, and third layers 1, 2, 3, each layer including a mold compound having a specified or desired CTE (e.g., a first mold compound portion 101, etc.) and conductive material (e.g., a first conductor 102, etc.) configured to transmit electrical signals through or among different layers of the multi-layer molded substrate 100. In an example, the conductive material can include copper (Cu), nickel (Ni), titanium (Ti), or one or more other conductive materials.

The multi-layer molded substrate 100 can include a three-layer MIS-BGA substrate, or one or more other substrate types, in accordance with the teachings herein, having more than two layers. The multi-layer molded substrate 100 has a bottom surface (e.g., a bottom surface of the first layer 1) and a top surface (e.g., a top surface of the third layer 3) configured to receive first and second structures, respectively. The conductive material in the multi-layer molded substrate 100 can transmit electrical signals between the first and second structures, between one of the first or second structures and one or more other structures, or between two or more other structures.

Figure 2:
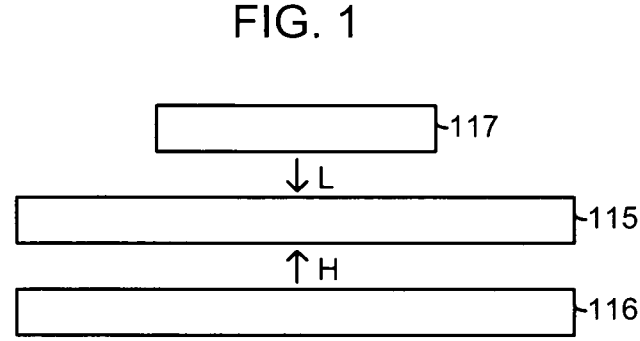
FIG. 2 illustrates generally an example microelectronic system including a multi-layer molded substrate configured to receive first and second structures at respective first and second surfaces of the multi-layer molded substrate.

FIG. 2 illustrates generally an example microelectronic system 200 including a multi-layer molded substrate 115 configured to receive first and second structures 116, 117 at respective first and second surfaces of the multi-layer molded substrate 115. In an example, the first structure 116 can include a motherboard, the multi-layer molded substrate 115 can include a three-layer MIS-BGA substrate, and the second structure 117 can include a die having one or more semiconductor components. In other examples, the system can include other structures or substrates.

To optimize thermal performance of the system 200, it can be advantageous that a bottom layer of the multi-layer molded substrate 115 have a relatively higher CTE to optimize thermal performance of the multi-layer molded substrate 115 with the first structure 116, and that a top layer of the multi-layer molded substrate 115 have a relatively lower CTE to optimize thermal performance of the multi-layer molded substrate 115 with the second structure. It is not required that the CTE of the top and bottom layers of the multi-layered molded substrate 115 match the respective first and second structures 116, 117. In an example, the multiple layers of the multi-layer molded substrate 115 can provide a CTE gradient between the first and second elements 116, 117, to optimize thermal performance, such as to distribute warpage or stress across the multi-layer molded substrate 115, reducing thermo-mechanical issues across the system 200.

Traditional substrates including a solder mask have a relatively higher CTE (e.g., 25-35), whereas an example MIS-BGA substrate, such as described herein, can have a range of CTE values from low to high (e.g., 7-50). In an example, a low CTE include a range between 7-10, or one or more other range lower than 20. Whereas, in certain examples, a high CTE can be any value above 20, 25, etc. Such characteristics can be used to provide the CTE gradient across the multiple layers of the multi-layer molded substrate 115. In other examples, the mold compounds can be modified to achieve desired CTE values, such as by modifying mold compound formulations, lowering filler content or modifying fillers, such as illustrated in Table 1, herein. In certain examples, additional conductive material, exposed or otherwise, separate from the conductive material configured to transmit electrical signals described above (e.g., the first conductor 102), or otherwise unnecessary for electrical signal transmission, can be added to one or more regions or layers of the multi-layer molded substrate 115 to further stiffen, improve warpage, or provide a heat sink for thermal dissipation of one or more of the layers of the multi-layer molded substrate 115.

Figure 3:
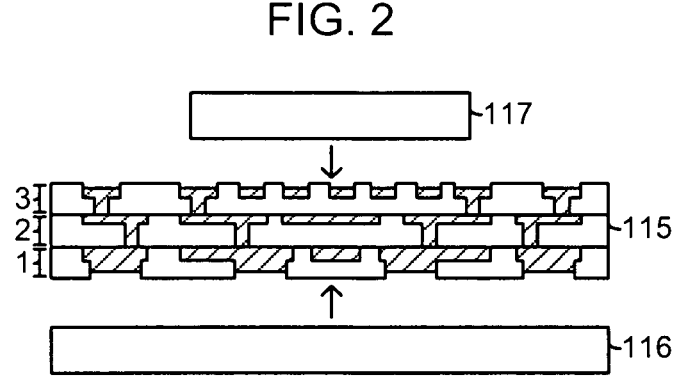
FIG. 3 illustrates generally an example microelectronic system including a multi-layer molded substrate including first, second, and third layers.

FIG. 3 illustrates generally an example microelectronic system 300 including a multi-layer molded substrate 115 including first, second, and third layers 1, 2, 3. The first layer 1 includes a bottom surface of the multi-layer molded substrate 115 and is configured to receive a first structure 116, such as a second level interconnect (SLI) region, for example, a motherboard region. The third layer 3 includes a top surface of the multi-layer molded substrate 115 and is configured to receive a second structure 117, such as a first level interconnect (FLI) region, for example, a die region. In this example, the first layer 1 has a high CTE, the second layer 2 has a medium CTE, and the third layer 3 has a low CTE. In an example, high, medium, and low CTE can be abstracted using the values in Table 1, herein.

Although the example microelectronic system 300 of FIG. 3 illustrates three layers, one or more other number of layers can be used (e.g., two layers, four layers, five layers, etc.). The layers can be progressively graded, from a low CTE to a high CTE.

In other examples, the multi-layer molded substrate 115 can include a number of layers, greater than three, with one or more middle layers configured to provide increased stiffness to the overall system, while the outer layers (e.g., top and bottom layers) are graded away from the stiff middle layer to minimize thermal mismatch between coupled first and second structures, respectively.

Table 1, below, illustrates generally example mold compound filler contents and filler type to vary the CTE between the layers of the multi-layer molded substrate.

configured to transmit electrical signals (e.g., the first conductor 102, etc.), in the first layer 1 to provide an increased stiffness and an outlet for thermal dissipation. In other examples, the additional conductive material can be buried within, or otherwise incorporated therewith, one or more of the layers of the multi-layer molded substrate 1400 to provide stiffness or increased thermal dissipation, as desired.

FIGS. 5-14 illustrate generally an example process flow to manufacture a MIS-BGA semiconductor package using a mold compound having one or more desired characteristics, such as a specific CTE.

Figure 5:
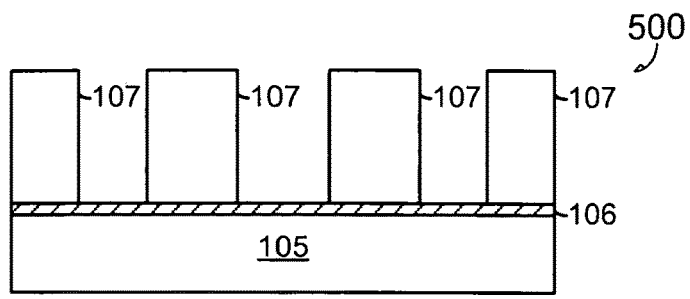
FIGS. 5-14 illustrate generally an example process flow to manufacture a layer of a MIS-BGA semiconductor package using a mold compound.

FIG. 5 illustrates generally an example cross section 500 including a carrier substrate 105, a seed layer 106 (e.g., copper (Cu), nickel (Ni), titanium (Ti), etc.) laminated or deposited on a top surface of the carrier substrate 105, and dry film resist (DFR) 107 can be patterned (e.g., laminated, exposed, developed, etc.) to form a template on a top surface of the seed layer 106.

Figure 6:
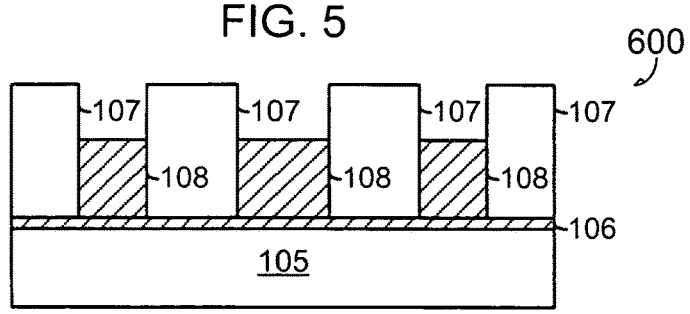
Figure 7:
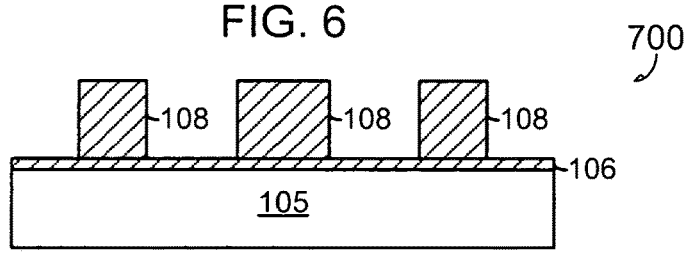

FIG. 6 illustrates generally an example cross section 600 including a first metal 108 (e.g., the same metal as the seed layer 106, such as Cu, etc., or one or more other metals) deposited (e.g., electrolytic Cu plating, etc.) on the exposed sections of the seed layer 106 between the remaining portions of the patterned DFR 107. After the first metal 108 is deposited, the DFR 107 can be removed (e.g., using developer, stripper, etc.). FIG. 7 illustrates generally an example cross section 700 with the DRF 107 removed.

Figure 8:
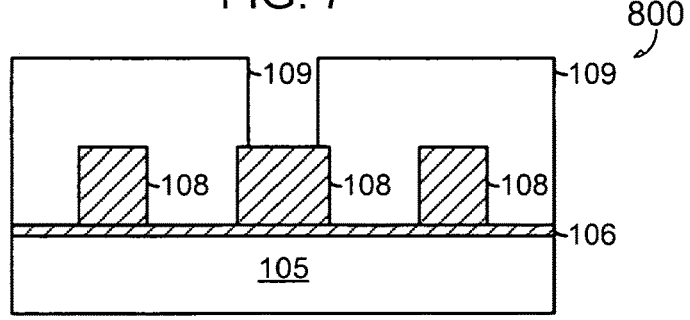

FIG. 8 illustrates generally an example cross section 800 including a second DFR 109 patterned to form a template on the seed layer 106 and the first metal 108. In an example, the second DFR can be patterned to expose at least a portion of the first metal 108.

Figure 9:
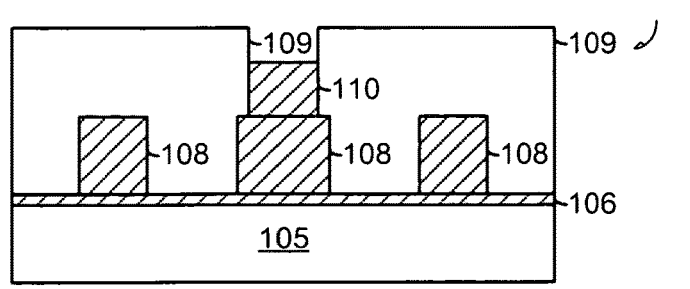

FIG. 9 illustrates generally an example cross section 900 including a second metal 110 (e.g., the same metal as the first metal 108, such as Cu, etc., or one or more other metals) deposited (e.g., electrolytic CU plating, etc.) on a top surface of the exposed first metal 108. In an example, the second metal 110 can be used as a via, or an electrical connection from the first metal layer to a top surface or another layer of a finished MIS-BGA semiconductor package, etc. After the second metal 110 is deposited, the second DFR 109 can be

TABLE 1

Mold Compound Formulations.

| Varying CTE with filler content | | | | Varying CTE with filler type | | | |
|---|---|---|---|---|---|---|---|
| Type | Mold Compound | Filler | CTE | Type | Mold Compound | Filler | CTE |
| Granular | Epoxy Phenol | Silica | 7-24 | Granular | Epoxy Phenol | Silica | 7-50 |
| Liquid | Epoxy Anhydride | Silica | | Granular | Epoxy Phenol | Alumina | |
| Liquid | Epoxy Amine | Silica | | Granular | Epoxy Phenol | Organic | |

Figure 4:
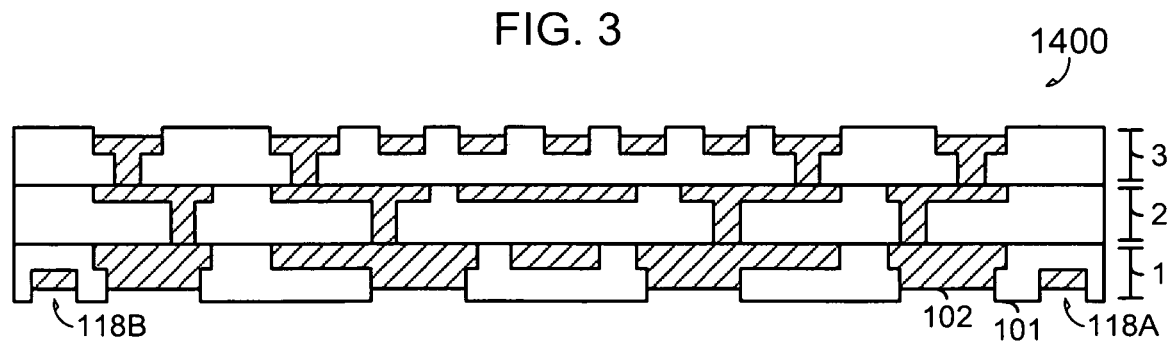
FIG. 4 illustrates generally an example multi-layer molded substrate including first, second, and third layers.
Figure 10:
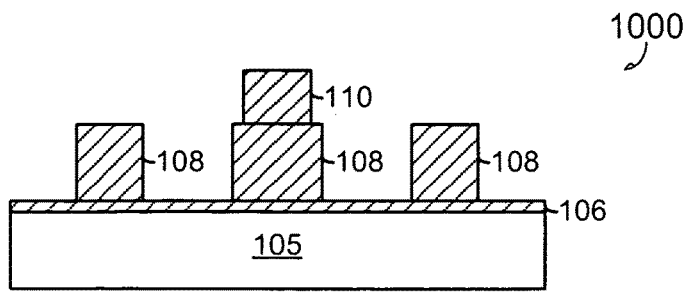

FIG. 4 illustrates generally a multi-layer molded substrate 1400 including first, second, and third layers 1, 2, 3, each layer including a mold compound having a specified or desired CTE (e.g., a first mold compound portion 101, etc.) and conductive material (e.g., a first conductor 102, etc.) configured to transmit electrical signals through or among different layers of the multi-layer molded substrate 1400. The multi-layer molded substrate 1400 includes additional conductive material (e.g., first and second exposed conductors 118A, 118B) separate from the conductive material removed (e.g., using developer, stripper, etc.). FIG. 10 illustrates generally an example cross section 1000 with the second DFR 109 removed.

Figure 11:
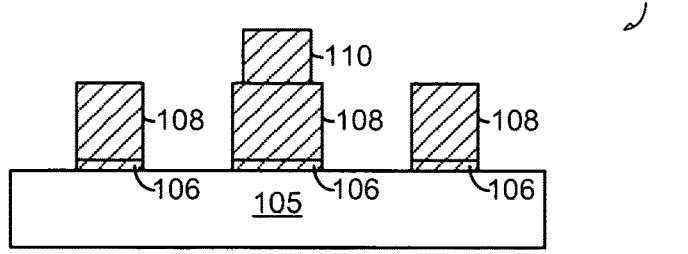

FIG. 11 illustrates generally an example cross section 1100 with the exposed portions of the first seed layer 106 (e.g., not covered by the first metal 108) removed (e.g., etched), isolating the remaining metal portions.

Figure 12:
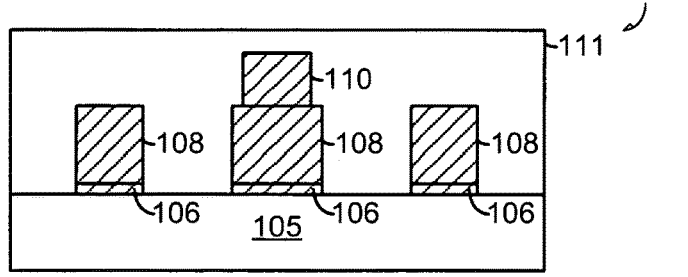
Figure 13:
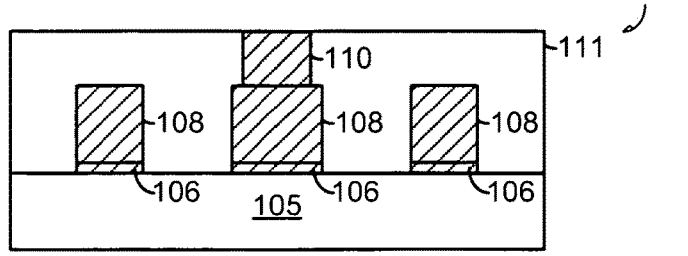

FIG. 12 illustrates generally an example cross section 1200 including a mold compound 111 disposed over the remaining metal. FIG. 13 illustrates generally an example cross section 1300 with a top portion of the mold compound 111 ground down to expose a top surface of the second metal 110. Following this step, with a traditional mold compound, the remaining surface of the mold compound 111 can be treated, such as using a wet etch or one or more other surface treatment options.

Figure 14:
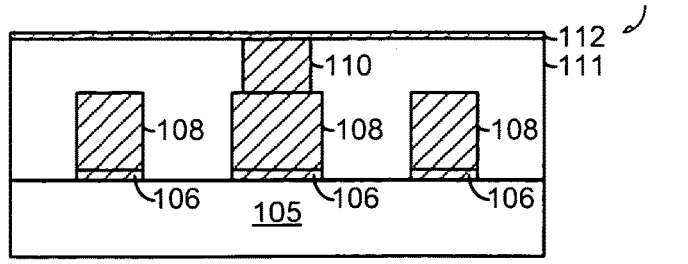

FIG. 14 illustrates generally an example cross section 1100 including a second seed layer 112 deposited (e.g., electro-less or sputter deposition, etc.) on a top surface of the mold compound 111. A plasma etch of the top surface of the mold compound 111 prior to the second seed layer 112 deposition can be optionally performed, if desired or necessary. Following completion of the first layer, one or more additional layers can be added, similar to the process described in FIGS. 5-14, with a mold compound having one or more different characteristics, such as a different CTE (e.g., higher or lower CTE, or a different CTE value at various temperatures). Once the desired configuration is reached, the carrier substrate 105 can be etched away or otherwise removed.

Isolated exposed conductive material described in FIG. 4 (118A, 118B), or isolated buried conductive material within one or more of the layers, can be created in the same flow above in desired regions by intentionally not forming vias or otherwise de-coupling the isolated conductive material to any conductors configured to carry electrical signals between or through one or more layers of the substrate.

Although described herein with respect to MIS-BGA packaging architecture, the systems and methods described herein can be used with one or more other packaging architectures, such as ePLB (Embedded Panel-Level Ball Grid Array), etc.

ADDITIONAL NOTES AND EXAMPLES

Example 1 is a system, comprising: a multi-layer molded substrate, including: a first molded layer including a first mold compound having a first coefficient of thermal expansion (CTE); and a second molded layer including a second mold compound having a second CTE lower than the first CTE, a third molded layer including a third mold compound having a third CTE lower than the second CTE, wherein the second molded layer is between the first and third molded layers.

In Example 2, the subject matter of Example 1 optionally includes, wherein the different first, second, and third CTEs are configured to optimize thermal performance of the multi-layer molded substrate with first and second structures attached to a bottom surface and a top surface of the multi-layer molded substrate, respectively.

In Example 3, the subject matter of any one or more of Examples 1-2 optionally include, including a first structure attached to a bottom surface of the first molded layer, the first structure having a higher CTE than the second and third CTEs; and a second structure attached to a top surface of the third molded layer, the second structure having a lower CTE than the first and second CTEs.

In Example 4, the subject matter of any one or more of Examples 1-3 optionally include, wherein the first molded layer is configured to closer match a CTE of a first structure attached to a bottom surface of the first molded layer than the second and third molded layers, and the third molded layer is configured to closer match a CTE of a second structure attached to a top surface of the third molded layer than the first and second molded layers.

In Example 5, the subject matter of Example 4 optionally includes, including the first and second structures, the first structure including a motherboard, and the second structure including a silicon die.

In Example 6, the subject matter of any one or more of Examples 1-5 optionally include, wherein the second molded layer is deposited on a top surface of the first molded layer, and the third molded layer is deposited on a top surface of the second molded layer.

In Example 7, the subject matter of any one or more of Examples 1-6 optionally include, including: a first conductor in the first molded layer, a second conductor in the second molded layer, and a third conductor in the third molded layer, wherein the first, second, and third conductors are configured to transmit electrical signals through the multi-layer molded substrate; and an exposed conductor in the first molded layer configured to increase stiffness of the first molded layer and to provide a thermal outlet for thermal dissipation.

In Example 8, the subject matter of Example 7 optionally includes, wherein the first, second, and third conductors include copper plating, and the exposed conductor includes copper electrically isolated from the first, second, and third conductors by the first mold compound.

Example 9 is a method for optimizing thermal performance of a multi-layer molded substrate, comprising: attaching a first structure to a bottom surface of a first molded layer including a first mold compound having a first coefficient of thermal expansion (CTE), wherein the multi-layer molding compound includes a second molded layer including a second mold compound having a second CTE lower than the first CTE; and attaching a second structure to a top surface of a third molded layer including a third mold compound having a third CTE lower than the second CTE, wherein the second molded layer is between the first and third molded layers, the second structure having a lower CTE than the first structure.

In Example 10, the subject matter of Example 9 optionally includes, wherein the first structure has a higher CTE than the second and third CTEs, and the second structure has a lower CTE than the first and second CTEs.

In Example 11, the subject matter of any one or more of Examples 9-10 optionally include, wherein the first molded layer is configured to closer match a CTE of the first structure than the second and third molded layers, and the third molded layer is configured to closer match a CTE of the second structure than the first and second molded layers.

In Example 12, the subject matter of any one or more of Examples 9-11 optionally include, wherein the first structure includes a motherboard, and the second structure includes a silicon die.

In Example 13, the subject matter of any one or more of Examples 9-12 optionally include, wherein the first molded layer includes an exposed conductor configured to increase stiffness of the first molded layer and to provide a thermal outlet for thermal dissipation.

Example 14 is a method, comprising: depositing a first conductor on a first surface of a carrier substrate, and a first mold compound having a first coefficient of thermal expansion (CTE) over the first conductor; removing at least a portion of the first mold compound, exposing at least a portion of the first conductor and creating a top surface of a first molded layer; depositing a second conductor on the top surface of the first molded layer, and a second mold compound having a second CTE lower than the first CTE over the second conductor; removing at least a portion of the second mold compound, exposing at least a portion of the second conductor and creating a top surface of a second molded layer; depositing a third conductor on the top surface of the second molded layer, and a third mold compound having a third CTE lower than the second CTE over the third conductor; removing at least a portion of the third mold compound, exposing at least a portion of the third conductor and creating a top surface of a third molded layer; and removing the carrier substrate.

In Example 15, the subject matter of Example 14 optionally includes, wherein the different first, second, and third CTEs are configured to optimize thermal performance of the multi-layer molded substrate with first and second structures attached to a bottom surface and a top surface of the multi-layer molded substrate, respectively.

In Example 16, the subject matter of any one or more of Examples 14-15 optionally include, including: attaching a first structure to a bottom surface of the first molded layer, the first structure having a higher CTE than the second and third CTEs; and attaching a second structure to a top surface of the third molded layer, the second structure having a lower CTE than the first and second CTEs.

In Example 17, the subject matter of any one or more of Examples 14-16 optionally include, wherein the first molded layer is configured to closer match a CTE of a first structure attached to a bottom surface of the first molded layer than the second and third molded layers, and the third molded layer is configured to closer match a CTE of a second structure attached to a top surface of the third molded layer than the first and second molded layers.

In Example 18, the subject matter of Example 17 optionally includes, including the first and second structures, the first structure including a motherboard, and the second structure including a silicon die.

In Example 19, the subject matter of any one or more of Examples 14-18 optionally include, including: removing at least a portion of the first conductor to create a first isolated conductor; and exposing the first isolated conductor at a bottom surface of the first molded layer to provide a thermal outlet for thermal dissipation, wherein the first isolated conductor increases the stiffness of the first molded layer.

In Example 20, the subject matter of Example 19 optionally includes, wherein the first, second, and third conductors include copper, and the first isolated conductor includes copper electrically isolated from the remainder of the first conductor by the first mold compound.

In Example 21, a system or apparatus can include, or can optionally be combined with any portion or combination of any portions of any one or more of Examples 1-20 to include, means for performing any one or more of the functions of Examples 1-20.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system, comprising:
a multi-layer molded substrate, including:
   a first molded layer including a first mold compound having a first coefficient of thermal expansion (CTE), a first conductor to transmit electrical signals through the multi-layer molded substrate, and an exposed conductor configured to increase stiffness of the first molded layer and to provide a thermal outlet for thermal dissipation;
   a second molded layer including a second mold compound having a second CTE lower than the first CTE and a second conductor to transmit electrical signals through the multi-layer molded substrate;
   a third molded layer including a third mold compound having a third CTE lower than the second CTE and a third conductor to transmit electrical signals through the multi-layer molded substrate,
   wherein the second molded layer is between the first and third molded layers, and
   wherein the first, second, and third conductors include copper plating, and the exposed conductor includes copper electrically isolated from the first, second, and third conductors by the first mold compound.

2. The system of claim 1, wherein the different first, second, and third CTEs are configured to optimize thermal performance of the multi-layer molded substrate with first and second structures attached to a bottom surface and a top surface of the multi-layer molded substrate, respectively.

3. The system of claim 1, including a first structure attached to a bottom surface of the first molded layer, the first structure having a higher CTE than the second and third CTEs; and
   a second structure attached to a top surface of the third molded layer, the second structure having a lower CTE than the first and second CTEs.

4. The system of claim 1, wherein the first molded layer is configured to closer match a CTE of a first structure attached to a bottom surface of the first molded layer than the second and third molded layers, and the third molded layer is configured to closer match a CTE of a second structure attached to a top surface of the third molded layer than the first and second molded layers.

5. The system of claim 4, including the first and second structures, the first structure including a motherboard, and the second structure including a silicon die.

6. The system of claim 1, wherein the second molded layer is deposited on a top surface of the first molded layer, and the third molded layer is deposited on a top surface of the second molded layer.

7. A method for optimizing thermal performance of a multi-layer molded substrate, comprising:
   attaching a first structure to a bottom surface of a first molded layer including a first mold compound having a first coefficient of thermal expansion (CTE), a first conductor to transmit electrical signals through the multi-layer molded substrate, and an exposed conductor configured to increase stiffness of the first molded layer and to provide a thermal outlet for thermal dissipation, wherein the multi-layer molding substrate includes a second molded layer including a second mold compound having a second CTE lower than the first CTE and a second conductor to transmit electrical signals through the multi-layer molded substrate; and
   attaching a second structure to a top surface of a third molded layer including a third mold compound having a third CTE lower than the second CTE and a third conductor to transmit electrical signals through the multi-layer molded substrate, wherein the second molded layer is between the first and third molded layers, the second structure having a lower CTE than the first structure,
   wherein the first, second, and third conductors include copper plating, and the exposed conductor includes copper electrically isolated from the first, second, and third conductors by the first mold compound.

8. The method of claim 7, wherein the first structure has a higher CTE than the second and third CTEs, and the second structure has a lower CTE than the first and second CTEs.

9. The method of claim 7, wherein the first molded layer is configured to closer match a CTE of the first structure than the second and third molded layers, and the third molded layer is configured to closer match a CTE of the second structure than the first and second molded layers.

10. The method of claim 7, wherein the first structure includes a motherboard, and the second structure includes a silicon die.

11. The method of claim 7, wherein the different first, second, and third CTEs are configured to optimize thermal performance of the multi-layer molded substrate with first and second structures attached to a bottom surface and a top surface of the multi-layer molded substrate, respectively.

12. The method of claim 7, wherein the second molded layer is deposited on a top surface of the first molded layer, and the third molded layer is deposited on a top surface of the second molded layer.

13. A method for optimizing thermal performance of a multi-layer molded substrate, comprising:
   depositing a first conductor on a first surface of a carrier substrate, and a first mold compound having a first coefficient of thermal expansion (CTE) over the first conductor;
   removing at least a portion of the first mold compound, exposing at least a portion of the first conductor and creating a top surface of a first molded layer;
   depositing a second conductor on the top surface of the first molded layer, and a second mold compound having a second CTE lower than the first CTE over the second conductor;
   removing at least a portion of the second mold compound, exposing at least a portion of the second conductor and creating a top surface of a second molded layer;
   depositing a third conductor on the top surface of the second molded layer, and a third mold compound having a third CTE lower than the second CTE over the third conductor;
   removing at least a portion of the third mold compound, exposing at least a portion of the third conductor and creating a top surface of a third molded layer; and
   removing the carrier substrate.

14. The method of claim 13, wherein the different first, second, and third CTEs are configured to optimize thermal performance of the multi-layer molded substrate with first and second structures attached to a bottom surface and a top surface of the multi-layer molded substrate, respectively.

15. The method of claim 13, including:
   attaching a first structure to a bottom surface of the first molded layer, the first structure having a higher CTE than the second and third CTEs; and
   attaching a second structure to a top surface of the third molded layer, the second structure having a lower CTE than the first and second CTEs.

16. The method of claim 13, wherein the first molded layer is configured to closer match a CTE of a first structure attached to a bottom surface of the first molded layer than the second and third molded layers, and the third molded layer is configured to closer match a CTE of a second structure attached to a top surface of the third molded layer than the first and second molded layers.

17. The method of claim 16, including the first and second structures, the first structure including a motherboard, and the second structure including a silicon die.

18. The method of claim 13, including:
  removing at least a portion of the first conductor to create a first isolated conductor; and
  exposing the first isolated conductor at a bottom surface of the first molded layer to provide a thermal outlet for thermal dissipation,
  wherein the first isolated conductor increases a stiffness of the first molded layer.

19. The method of claim 18, wherein the first, second, and third conductors include copper, and the first isolated conductor includes copper electrically isolated from a remainder of the first conductor by the first mold compound.

20. The method of claim 13, wherein the first molded layer is configured to closer match a CTE of a first structure attached to a bottom surface of the first molded layer than the second and third molded layers.

\* \* \* \* \*